(12) United States Patent  
Hsu

(10) Patent No.: US 9,131,613 B2  
(45) Date of Patent: Sep. 8, 2015

(54) PICK UP CAP USED FOR ELECTRICAL CONNECTOR

(71) Applicant: HON HAI PRECISION INDUSTRY CO., LTD., New Taipei (TW)

(72) Inventor: Shuo-Hsiu Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 1 day.

(21) Appl. No.: 14/183,419

(22) Filed: Feb. 18, 2014

(65) Prior Publication Data

US 2014/0235098 A1 Aug. 21, 2014

(30) Foreign Application Priority Data

Feb. 18, 2013 (TW) .............................. 102105458 A

(51) Int. Cl.  
*H01R 13/44* (2006.01)  
*H05K 7/10* (2006.01)

(52) U.S. Cl.  
CPC .................................... *H05K 7/1007* (2013.01)

(58) Field of Classification Search  
CPC .................................................... H01R 43/205  
USPC ................................................. 439/135, 940  
See application file for complete search history.

(56) References Cited

U.S. PATENT DOCUMENTS

| 5,383,797 | A | * | 1/1995 | Seong et al. ................... 439/569 |
| 6,155,863 | A | * | 12/2000 | Matsuzaki et al. ............. 439/353 |
| 6,547,609 | B2 | * | 4/2003 | Howell et al. ................. 439/149 |
| 6,554,625 | B1 | | 4/2003 | Liao et al. |
| 6,877,990 | B2 | * | 4/2005 | Liao et al. ....................... 439/41 |
| 7,037,116 | B1 | * | 5/2006 | Liao et al. ....................... 439/71 |
| 7,070,427 | B2 | * | 7/2006 | Liao et al. ..................... 439/135 |
| 7,112,066 | B2 | * | 9/2006 | Liao et al. ....................... 439/41 |
| 7,429,181 | B2 | * | 9/2008 | Liao ............................... 439/135 |
| 7,708,571 | B2 | * | 5/2010 | Terhune et al. ............... 439/135 |
| 7,883,345 | B2 | * | 2/2011 | Yeh et al. ...................... 439/135 |
| 7,955,086 | B1 | * | 6/2011 | Howell ........................... 439/41 |
| 8,998,623 | B2 | * | 4/2015 | Hsu ................................. 439/70 |
| 2005/0130472 | A1 | * | 6/2005 | Hou ............................... 439/135 |
| 2014/0235098 | A1 | * | 8/2014 | Hsu ............................... 439/577 |

* cited by examiner

*Primary Examiner* — Neil Abrams  
(74) *Attorney, Agent, or Firm* — Wei Te Chung; Ming Chieh Chang

(57) ABSTRACT

An electrical connector assembly, includes an electrical connector, a pick up cap mounted on the electrical connector, and a film. The pick up cap has a top surface and a bottom surface. The top surface has a holding surface defining a plurality of through holes. A film includes a connecting portion connected with the bottom surface of the pick up cap and a moved portion moved between an open position and a closed position. When the moved portion located in the open position, the through hole of the pick up cap is opened. When the moved portion located in the closed position, the through hole of the pick up cap is closed.

20 Claims, 4 Drawing Sheets

PICK UP CAP USED FOR ELECTRICAL CONNECTOR

BACKGROUND OF THE INVENTION

1. Field of the Invention

The present invention relates to an electrical connector assembly, and more particularly to a pick up cap used for an electrical connector.

2. Description of Related Art

U.S. Pat. No. 6,554,625 issued to Liao et al. on Apr. 29, 2003 discloses a socket assembly includes a socket and a pick up device releasably mounted to the socket. The socket has a base and a cover slidably mounted on the base. The pick up device includes a cap and a film member adhered to the cap. The cap is releasably mounted to the cover of the socket and defines a pair of through slots. The film member is adhered to the top face of the cap to cover the through slots for being manipulated by the vacuum suction device to position the CPU socket on a printed circuit board. When the socket is soldered to the printed circuit board, the socket has a temperature difference between the center and the peripheral because soldering heat generated is prevented by the film member. Thus the contact can not well weld to the printed circuit board.

Therefore, an improved electrical connector assembly is needed.

SUMMARY OF THE INVENTION

An object of the present invention is to provide an electrical connector assembly with a pick up cap mounted on the electrical connector, the pick up cap provided a film can reduce the temperature difference between an center and the peripheral of the electrical connector.

According to one aspect of the present invention, an electrical connector assembly, comprises an electrical connector, a pick up cap mounted on the electrical connector, and a film. The pick up cap has a top surface and a bottom surface. The top surface has a holding surface defining a plurality of through holes. A film includes a connecting portion connected with the bottom surface of the pick up cap and a moved portion moved between an open position and a closed position. When the moved portion located in the open position, the through hole of the pick up cap is opened. When the moved portion located in the closed position, the through hole of the pick up cap is closed.

According to another aspect of the present invention, a pick up cap, comprises a cover having two opposite sides. One of the sides has a holding surface with a plurality of through holes extending through the two opposite sides. A film is connected to the side opposite the holding surface and includes a plurality of moved portions which can open and close the through hole.

Other objects, advantages and novel features of the invention will become more apparent from the following detailed description of a preferred embodiment when taken in conjunction with the accompanying drawings.

DETAILED DESCRIPTION OF THE INVENTION

Figure 1:
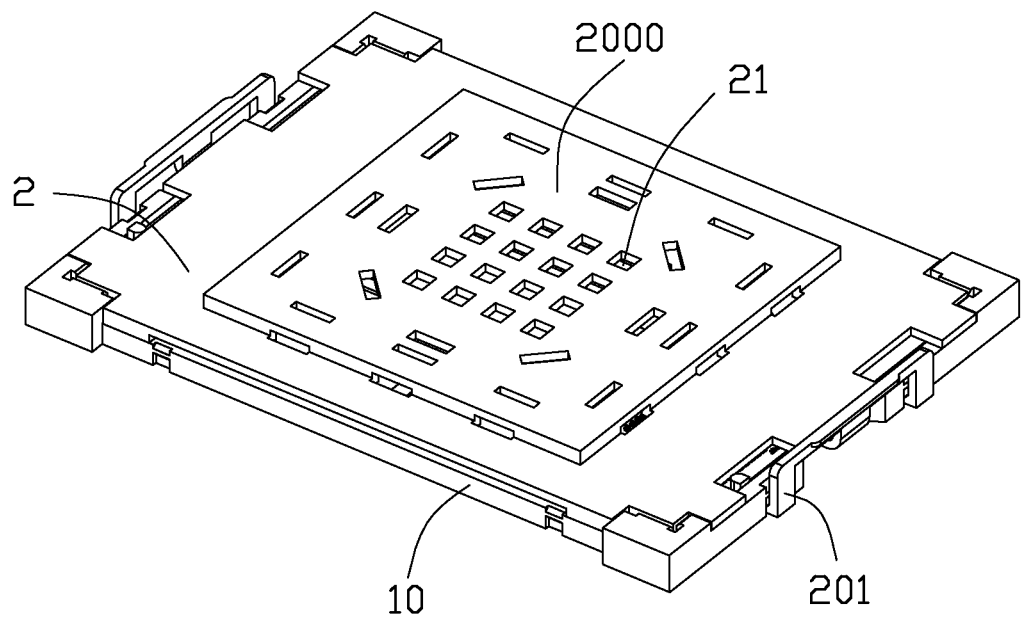
FIG. 1 is an assembled, perspective view of an electrical connector in accordance with the present invention.

Referring to FIG. 1, an electrical connector 1 used for electrically connected an electronic package (not shown) to a printed circuit board (not shown) with a pick up device 2 mounted on the electrical connector 1, comprises an insulative housing 10 and a plurality of contacts 11 received thereof.

Figure 2:
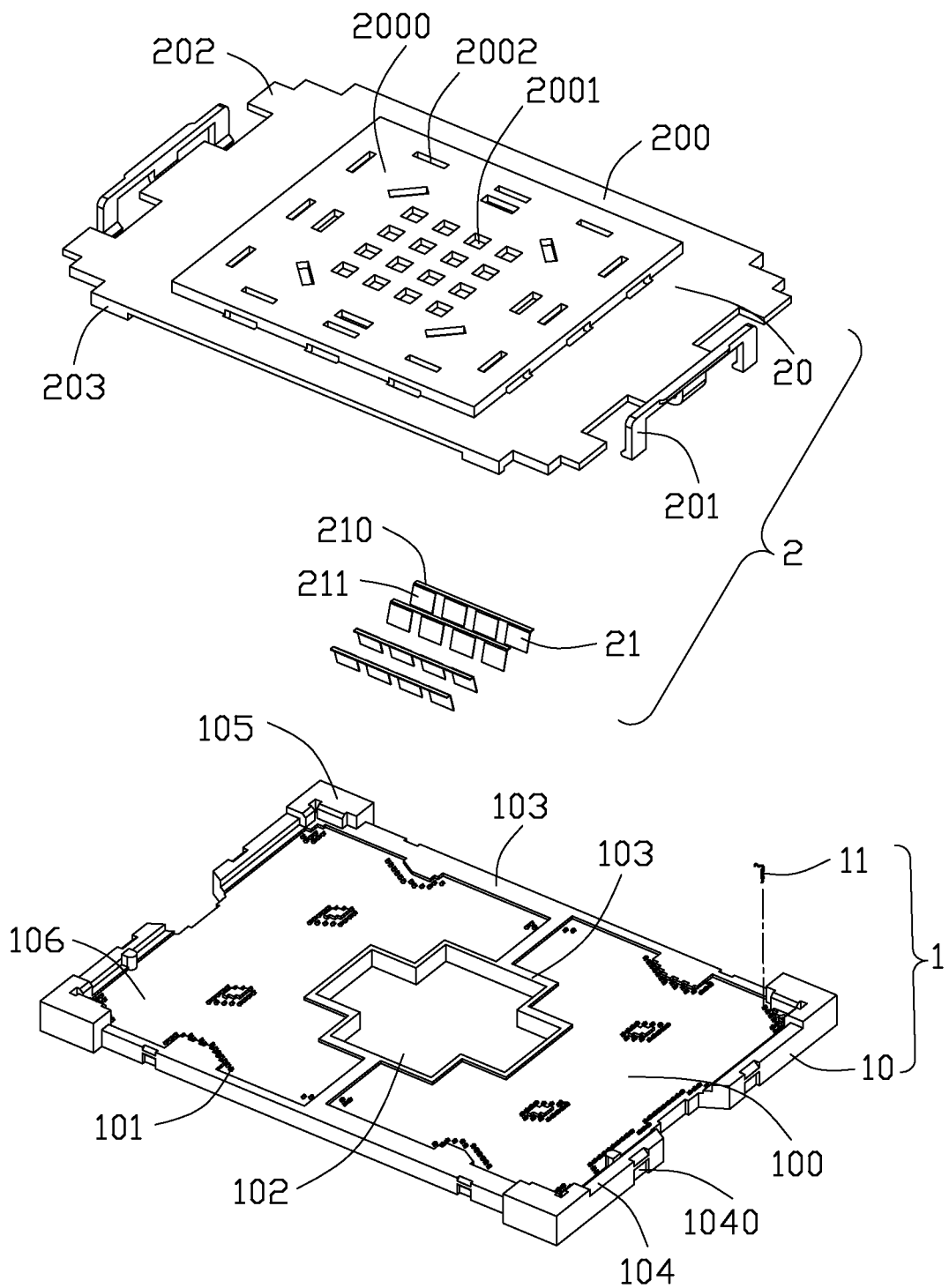
FIG. 2 is an exposed, perspective view of the electrical connector shown in FIG. 1.

Referring to FIGS. 1 and 2, the insulative housing 10 has a substantially rectangular shape and includes a base 100 with a plurality of passageways 101 to receive the contacts 11. The base 100 includes an opening 102 at center thereof and a plurality of ribs 103 extending upwardly from a top surface of edges of the base 100 for supporting the electronic package. The base 100 further has a pair of sidewalls 104 disposed two opposite sides of the base 100 and extending higher than the ribs 103. Each of the sidewall 104 defines recesses 1040 at outer sides thereof for receiving the pick up device 2. The insulative housing 100 includes four protrusions 105 at corners to form a receiving room 106 for receiving the electronic package.

The pick up device 2 includes a pick up cap 20 and a plurality of films 21. The pick up cap 20 includes a cover 200 located upon the contacts 11 and latches 201 extending downwardly from the cover 200. The latches 201 of the pick up cap 20 are assembled to the recesses 1040 of the insulative housing 10 to achieve a lock station therebetween. The cover 200 defines a holding surface or suction area 2000 with a plurality of through holes 2001 and a plurality of apertures 2002 around the through holes 2001. The through holes 2001 area is provided for the vacuum suction device (not shown) manipulating. The apertures 2002 and the through holes 2001 are provided extending in a vertical direction for changing airflow. The cover 200 includes a number of projections 202 extending from two opposite sides thereof to be supported by the sidewalls 104 of the insulative housing 10 and a number of blocks 203 extending from another two opposite sides thereof to be supported by the ribs 103 of the insulative housing 1, so that the cover 20 and the insulative housing 10 defines a gap therebetween to allow the receiving room 106 communicate with exterior.

Figure 3:
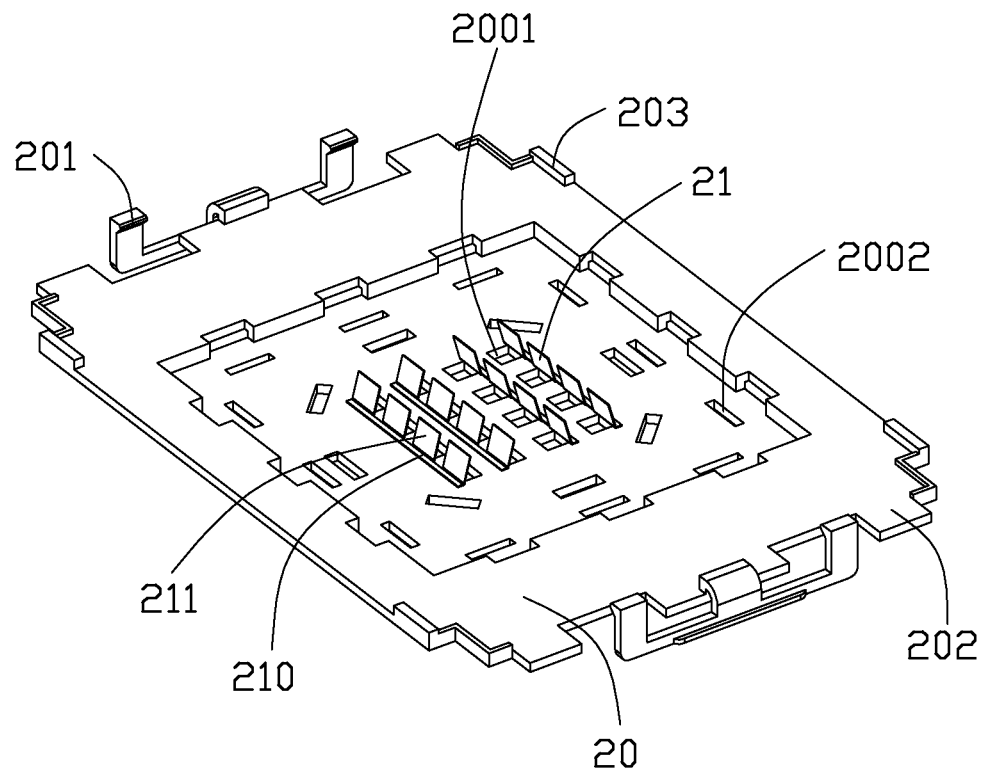
FIG. 3 is bottom view of a pick up device of the electrical connector, wherein through holes of the pick up device are opened.
Figure 4:
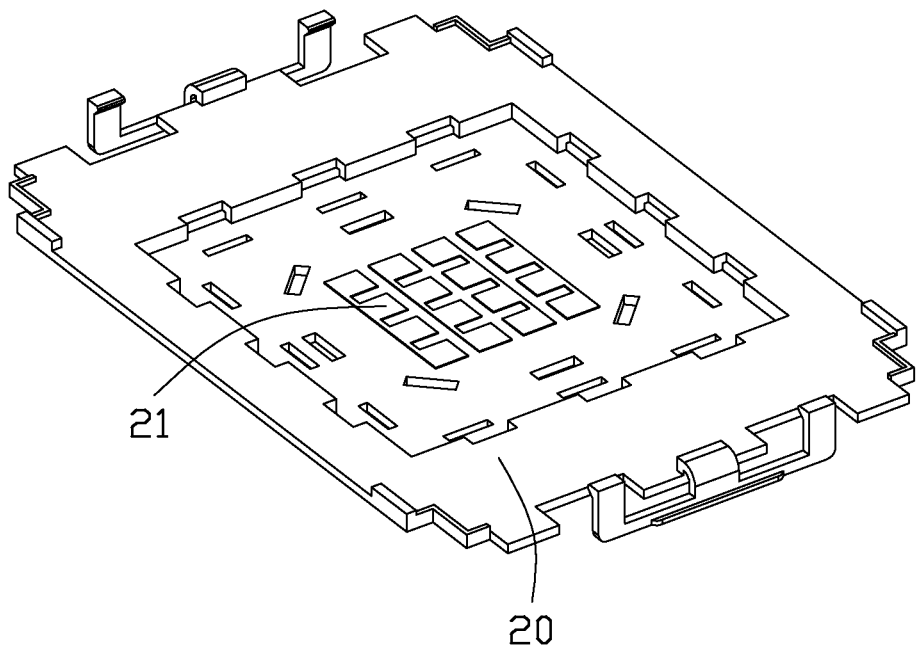
FIG. 4 is similar view of FIG. 3, wherein the through holes of the pick up device are closed by films.

Referring to FIG. 3 and FIG. 4, the films 21 are adhered to a bottom surface of the cover 200 corresponding to the through holes 2001. Each film 21 includes a connecting portion 210 and a number of moved portions 211 linked with the connecting portion 210. In this embodiment, the connecting portion 210 is a long strip used for adhering to the bottom surface of the cover 200. The moved portions 211 are corresponding to the through holes 2001 and each has a size slightly larger than the through hole 2001. When the vacuum suction device begins to absorb on the holding surface 2000, the moved portions 211 close the through hole 2001 by the air flow. When the vacuum suction device is removed from the holding surface 2000, the moved portions 211 open the through hole 2001 by gravity. In the instant invention, the air can flow through the apertures 2002 and the through holes 2001 of the cover 200 when the electrical connector is welded to the printed circuit board so that to reduce the temperature difference between the center and peripheral of the electrical connector.

In the instant invention, the films 21 is disposed opposite the holding surface 2000 and can be moved between an open position and a closed position with regard to the cover 200 without manual operation. The connecting portion 210 in this embodiment has a plurality of moved portions 211 corresponding to every through holes 2001, in alternatively embodiment, the connecting portion 210 can has one moved portion 211 to cover all the through holes 2001 disposed in one row.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly, comprising:
    an electrical connector;
    a pick up cap mounted on the electrical connector, the pick up cap having a top surface and a bottom surface, the top surface having a holding surface defining a plurality of through holes;
    a film including a connecting portion connected with the bottom surface of the pick up cap and a moved portion moved between an open position and a closed position; and wherein
    when the moved portion located in the open position, the through hole of the pick up cap is opened; when the moved portion located in the closed position, the through hole of the pick up cap is closed.

2. The electrical connector assembly as claimed in claim 1, wherein the film is made of plastic thin film.

3. The electrical connector assembly as claimed in claim 1, wherein a plurality of moved portions corresponding the through holes disposed in one row are linked with one connecting portion, and each moved portions has a size slightly larger than the through hole.

4. The electrical connector assembly as claimed in claim 1, wherein a plurality of apertures are defined around the through holes.

5. The electrical connector assembly as claimed in claim 1, wherein the electrical connector includes an insulative housing and a plurality of contacts received in the insulative housing, and the pick up cap includes a cover located upon the contacts, and wherein the holding surface is defined on the cover.

6. The electrical connector assembly as claimed in claim 5, wherein the insulative housing has a plurality of ribs disposed at edges thereof and two opposite ribs has sidewalls extending higher than the ribs.

7. The electrical connector assembly as claimed in claim 6, wherein the cover includes a number of projections extending from two opposite sides thereof to be supported by the sidewalls of the insulative housing and a number of blocks extending from another two opposite sides thereof to be supported by the ribs of the insulative housing.

8. The electrical connector assembly as claimed in claim 6, wherein the cover includes latches extending downwardly to be received in recesses defined on the outer sides of the sidewalls.

9. A pick up cap, comprising:
    a cover having two opposite sides, and one of the sides having a holding surface with a plurality of through holes extending through the two opposite sides;
    a film connected to the side opposite the holding surface and including a plurality of moving portions which can open and close the through hole.

10. The pick up cap as claimed in claim 9, wherein the film includes a connecting portion having a long strip type for adhering to the cover.

11. The pick up cap as claimed in claim 9, wherein each connecting portion has a plurality of the moving portions corresponding to the through holes disposed in one row.

12. The pick up cap as claimed in claim 9, wherein each moved portion has a size larger than the corresponding through hole.

13. The pick up cap as claimed in claim 9, wherein the cover includes latches extending downwardly.

14. An electrical connector assembly comprising:
    an electrical connector;
    a pick up cap mounted upon a top face of the electrical connector, and including a cover defining a suction area, a plurality of through holes formed in the suction area, each of said though holes being equipped with a moveable piece adapted to be in a lower position, via the owned gravity thereof, to open the corresponding through hole for heat ventilation and an upper position, via a suction force, to close the corresponding through hole for picking the electrical connector upwardly.

15. The electrical connector assembly as claimed in claim 14, wherein said moveable piece is a film.

16. The electrical connector assembly as claimed in claim 14, wherein said suction area is located a center region of the pick up cap and upward raised above peripheral regions of the pick up cap.

17. The electrical connector assembly as claimed in claim 14, wherein each of said moveable piece is attached to one edge of the through hole.

18. The electrical connector assembly as claimed in claim 14, wherein said through holes are formed in a center region of the pick up cap, and a plurality of through apertures formed in peripheral regions of the pick up cap surrounding said through holes.

19. The electrical connector assembly as claimed in claim 14, wherein said through aperture is of a slender shape while said through hole is close to a square shape.

20. The electrical connector assembly as claimed in claim 14, wherein said through holes are commonly aligned with a center opening an insulative housing of the electrical connector.

* * * * *